United States Patent [19]

Lucas

[11] 3,947,725
[45] Mar. 30, 1976

[54] PROTECTIVE SYSTEM FOR A CAPACITOR VOLTAGE TRANSFORMER

[76] Inventor: Howard R. Lucas, 398 Lake Promenade, Toronto, Ontario, Canada

[22] Filed: Nov. 6, 1973

[21] Appl. No.: 413,395

[30] Foreign Application Priority Data
Nov. 9, 1972   Canada ................................. 156085

[52] U.S. Cl. .............................. 317/12 B; 324/126
[51] Int. Cl.² .......................................... H02H 7/16
[58] Field of Search ............. 317/12 B, 12 A, 12 R; 324/126

[56] References Cited
UNITED STATES PATENTS

| | | | |
|---|---|---|---|
| 2,504,860 | 4/1950 | Marbury | 317/12 A |
| 2,756,414 | 7/1956 | Doremus | 324/126 X |
| 3,497,771 | 2/1970 | Korkka | 317/12 R |
| 3,517,263 | 6/1970 | Okamura et al. | 317/12 R |
| 3,530,502 | 9/1970 | Nishidai | 317/12 B |

FOREIGN PATENTS OR APPLICATIONS

| | | | |
|---|---|---|---|
| 1,140,673 | 3/1957 | France | 324/126 |
| 1,026,421 | 3/1958 | Germany | 324/126 |
| 1,269,719 | 6/1968 | Germany | 324/126 |
| 1,083,424 | 6/1960 | Germany | 324/126 |

*Primary Examiner*—James D. Trammell

[57] ABSTRACT

Capacitive voltage transformers for measurement of voltage for metering and protective relay purposes on high voltage power transmission systems including a protective system therefor which consists of modifying the inductive value of the inductance in the circuit in response to a condition of the circuit which is abnormal to the normal operation thereof. The inductive value is varied, in one instance, by short circuiting the winding thereof, short circuiting occurring through the use of a triggering device operated in response to an over-voltage in the system. In another instance, the inductive value is varied by providing a further coil magnetically coupled to the inductance and which further coil is energized upon triggering of a device in circuit therewith upon abnormal operating conditions of the line in response to such abnormal condition.

2 Claims, 3 Drawing Figures

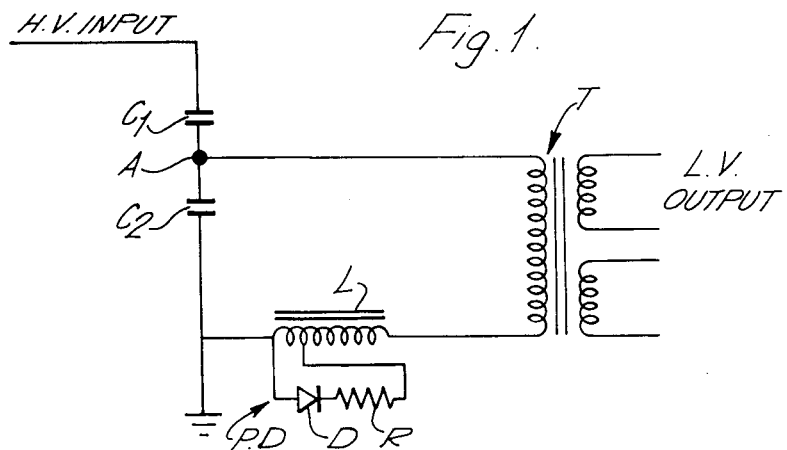
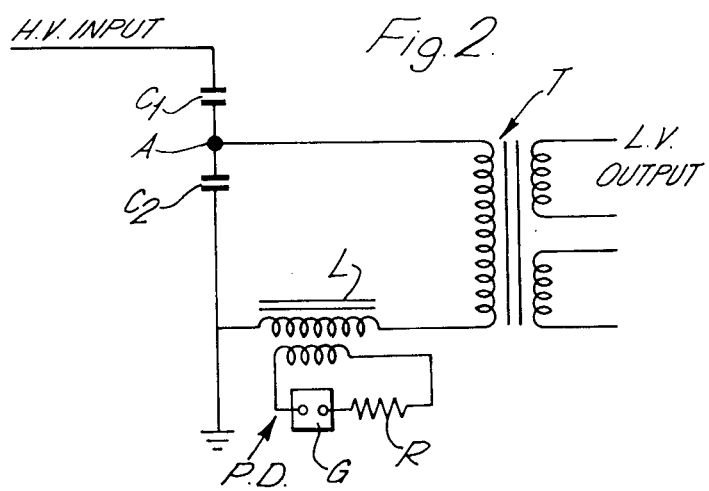
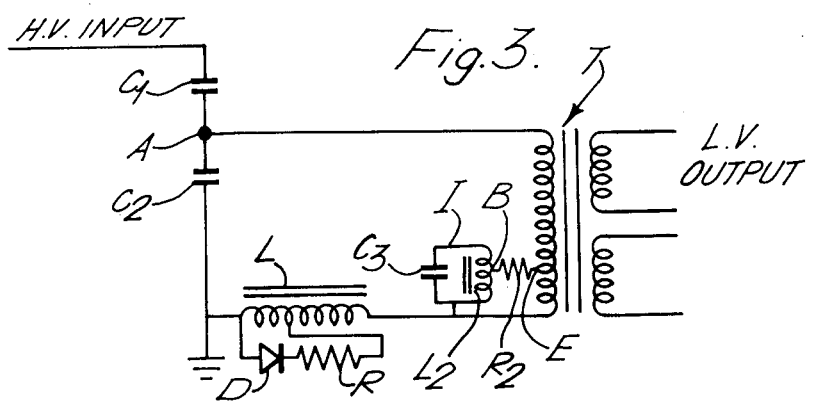

PROTECTIVE SYSTEM FOR A CAPACITOR VOLTAGE TRANSFORMER

This invention relates to improvements in capacitor voltage transformers and more particularly to protective systems therefor.

The use of capacitor voltage transformers for the measurement of voltage for metering and protective relaying purposes on high voltage power transmission systems is well known and standards for the performance and testing of the same have been developed. In such devices, a high voltage capacitor (preferably of conservative design and high insulation reliability) is connected between the high voltage line to be measured and ground. The capacitor is provided with a tapping point at some intermediate voltage, for example, at about 1/20 of the total voltage. A small electromagnetic transformer of suitable design is connected from the tapping point to ground. The low voltage or secondary winding output of the transformer is used to supply the meters, relays or other devices as required by the user.

In the known devices, the high voltage circuit consists of a pair of capacitors in series. An intermediate voltage transformer is connected to the high voltage circuit at a tapping point between the condensers. An inductance is provided either on the high-voltage side of the transformer or on its grounded side. The inductance is chosen that the total inductive reactance (including the transformer) of the intermediate voltage loop will be at or near a resonant condition (at the operating frequency of the device) with the total capacitance of the capacitors. This is necessary to permit the output voltage of the transformer to be as nearly as possible in phase with the H.V. input voltage.

In practice, most of the inductance is provided by an iron-core reactor with a fixed air gap. The inductance is adjusted by means of tappings in the windings, (to the desired value) to match the capacitor with which it is used. The transformer is also provided with tapping points in its windings so that the L.V. output can be adjusted to the desired ratio with the H.V. input. It has been found necessary in past practice to provide protective gaps either across the capacitors or inductance or both to relieve dangerously high overvoltages which might otherwise occur within the device as a result of system overvoltage, lightning surges, sudden switching, or inadvertent short circuit of the secondary windings. Such surges are known to generate a condition known as ferroresonance within the devices and many schemes have been developed to make the circuit less prone to ferroresonant oscillations or to suppress them if they do occur.

Most of the schemes to eliminate the problem of ferroresonance of self sustained (possibly overvoltage) oscillations within the device involve some method of mechanically or electrically (by means of an auxiliary transformer, for example) inserting some kind of loading resistance into the circuit so that the energy in the oscillations can be speedily dissipated and the circuit speedily returned to normal operating conditions. In some cases, this ferroresonant damping resistor is connected to the low voltage output windings of the transformer.

The following patents are exemplary of prior art devices and systems:

Canadian Pat. No. 873,509, issued June 15, 1971 to MICAFIL AG
Canadian Pat. No. 832,597, issued Jan. 20, 1970 to MICAFIL AG
Canadian Pat. No. 855,827, issued Nov. 1970 to General Electric Company
Canadian Pat. No. 744,818, issued Oct. 18, 1966 to Nissin Electric
Canadian Pat. No. 793,972, issued Sept. 3, 1968 to MICAFIL AG
Canadian Pat. No. 669,678, issued Sept. 3, 1963 to MICAFIL AG.

Tests have evolved to evaluate the effectiveness of the circuit in suppressing ferroresonance which consist of energizing the device in the normal manner at 120 percent of its rated voltage, then momentarily applying a short circuit to the L.V. output terminals. Effectiveness of the circuit is measured in the shortness of time required for the output voltage to return to its proper value, after the short circuit is removed. The normal requirement is that the output voltage return to normal value within 10 cycles. The prior art devices, however, have been found to have effects extending beyond the 10-cycle requirement.

A principal object of the present invention is to provide improvements in supressing overvoltage oscillations within the intermediate circuit of the device which are caused by the abnormal conditions mentioned above.

A further object is to provide a system for suppression of transient oscillations, returning the output voltage to its proper value consistently and in a minimum number of cycles. A still further object is to eliminate the previously used protective spark gaps which are regarded as having been a necessary evil, since the rapidity with which the voltage collapses across a spark gap is so great that additional dangerous stresses are generated by their sparking within the windings of transformer and inductance.

Accordingly, there is provided in accordance with the present invention improvements in a protective system of a circuit in a capacitor voltage transformer which includes an inductance in the circuit thereof minimizing the occurrence of dangerous over-voltages therein upon occurrence of an abnormal over-voltage applied thereto, permitting the voltage to return to normal promptly and smoothly upon removal of the disturbance comprising first means to modify the inductive value of said inductance and means capable of triggering said first means to operate only above a predetermined condition and in response to occurrence of said abnormal condition.

The invention is illustrated by way of example in the accompanying drawing, wherein:

FIG. 1 is a schematic circuit of one embodiment;
FIG. 2 is a schematic of a second embodiment; and
FIG. 3 is a schematic of a further embodiment.

Referring now to the drawing, the high voltage circuit consists of the capacitors $C_1$ and $C_2$ in series. An intermediate voltage transformer T is connected to a tapping point A between the capacitors. An iron cored inductance L is lsocated on the grounded side of transformer T. Such inductance however could be located between tapping point A and the transformer T without materially changing the performance of the device.

The inductance L has tappings (not shown) for the purpose of adjustment of its inductance. A protective device PD is connected across some portion of the winding of inductance L as shown in FIG. 1, or alternatively, across a suitable additional winding on the same core as shown in FIG. 2. In the first instance, the portion of winding concerned may be suitably increased in ruggedness to withstand the currents which will flow when the protective device becomes conducting. In the second instance, the separate section of winding is insulated from the rest, and possibly connected to ground at one point or it may be connected in series with the main inductance winding or to any point of it. The protective device PD consists of a suitable voltage limiting device such as a spark gap G (FIG. 2) or semiconducting diode D (FIG. 1) in series with a resistance R. Resistance R may be partly or wholly composed of the winding resistance of the part of inductance L to which the protective device is connected.

The sole requirement of the protective device is that it become conducting when the current in the inductance L (or the voltage across it) has risen to a predetermined value. When this occurs, the current in the portion of winding to which it is connected is suddenly allowed to rise and that portion of the winding is thus effectively short circuited. The voltage across the tuning inductance L is thus sharply reduced by the transformer action between the short circuited portion and the main winding and dangerous overvoltages in the intermediate circuit of the capacitor voltage transformer are prevented.

Several devices of satisfactory characteristics for the protective device are available. The protective portion of the winding can be modified to use units of relatively low current carrying capability and higher voltage withstand levels or units of high current carrying capability coupled with low voltage withstand levels. Silicon diodes, zener diodes, triacs or other triggerable conductive or semi-conductive devices may be used with suitable modifications of the protective winding.

Satisfactory results have been obtained in a test unit utilizing the following components with a high voltage input of 115 K.V: $C_1$ and $C_2$, respectively 0.006 $\mu f$ and 0.087 $\mu f$, Inductance L arranged to be tuned precisely with $C_1 + C_2$ and having a value of roughly 81 henries, the protective device D being a gas-filled protective gap with a momentary current rating of 5 amperes and a spark-over level of approximately 200V rms. The Resistance R in such arrangement was 10 ohms. The transformer preferably has the characteristics of minimum losses, i.e. lowest copper and iron losses practical, low flux densities so its core could not easily be forced into saturation and insulation reliability. The low voltage output, by suitable taps, provides operation at desired voltages of, for example, 115V or 66.4V or other multiples of the high input voltage permitting ready conversion.

In FIG. 3, there is shown a further modification wherein an iron cored inductance $L_2$ having a condenser $C_3$ in parallel therewith is connected at a top B through a resistance $R_2$ to a tap E of the transformer T. Good results have been found in such an arrangement wherein the tap portion E of the transformer T is 140V and the tapped portion B of the iron cored inductance $L_2$ is also 140V. The iron cored inductance $L_2$ is chosen to give 60-cycle resonance with a particular Capacitor $C_3$. In tests, good results have been found utilizing a 10-ohm Resistor $R_2$ and a 10 $\mu f$ condensor $C_3$. In the tests, poor results were found in having tap T at 220V when the tap point C was at 140V. It was thus demonstrated that the voltage rating of the inductor $L_2$ should correspond to the portion of the transformer winding to which it is connected. It will further be understood that this further portion of the circuit may be connected anywhere to the transformer T in a similar manner to the connection of the protective device to the inductance L described above.

The operation of the protective device may be described as follows:

When a disturbance such as a momentarily applied short circuit on the L.V. output of the transformer occurs, the impedance of transformer T is drastically reduced and inductor L is placed electrically in parallel with capacitor $C_2$, with which it has been adjusted to resonate. The voltage of the parallel combination of L and $C_2$ rises very sharply and high currents tend to circulate within the two elements. The fast-acting voltage-limiting device (D or G) starts conducting at a suitable voltage level effectively short circuiting the portion of the winding across which it is connected. This collapses the voltage across inductor L and takes it out of resonance with capacitor $C_2$. The voltage at A is thereby prevented from building up to a dangerously high level.

When the disturbance which caused the impedance of transformer T to be reduced is passed or removed, the circuit returns to normal operation smoothly and with minimum delay. The insulation requirements in transformer T and inductance L are considerably reduced by elimination of the high voltage surges which would have been generated by the spark-over of protective gaps across $C_2$ or L according to previous practice.

The foregoing system may be provided as a complete unit for installation, or alternatively, existing installations may be converted by modifying the inductance L to incorporate the embodiments of FIGS. 1 or 2. Alternatively, existing installations may be modified by substituting an inductance L in accordance with the present invention for the inductance used in existing installations.

In the foregoing embodiments, the transformer T is provided with two secondary windings and a useful burden may be connected in series with one of the secondary windings. The other secondary winding may have connected in series therewith and adapting circuit or harmonic suppression filter consisting of the parallel LC circuit in series with a resistor.

I claim:

1. Improvements in a protective system of a circuit in a capacitor voltage transformer which includes an inductance in the circuit thereof minimizing the occurrence of dangerous overvoltages upon occurrence of an abnormal overvoltage applied thereto, permitting the voltage to return to normal promptly and smoothly upon removal of the occurrence, said improvement comprising means short circuiting only a portion of the winding of said inductance for modifying the inductive value of said inductance, a triggering device in series in said short circuiting means and operative only above a predetermined condition and in response to occurrence of said abnormal condition and resistance means in series with said triggering means whereby the inductance is modified into a resistance by means of transformer action thus permitting a smooth transition from a normal operation to a dampening mode.

2. The system as claimed in claim 1, wherein said resistance is provided within the winding of the inductance.

* * * * *